(12) United States Patent
Takano et al.

(10) Patent No.: US 11,251,177 B2
(45) Date of Patent: Feb. 15, 2022

(54) SEMICONDUCTOR DEVICE

(71) Applicant: Mitsubishi Electric Corporation, Tokyo (JP)

(72) Inventors: Kazutoyo Takano, Fukuoka (JP); Hiroyuki Nakamura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/791,188

(22) Filed: Feb. 14, 2020

(65) Prior Publication Data
US 2020/0388608 A1 Dec. 10, 2020

(30) Foreign Application Priority Data
Jun. 7, 2019 (JP) .............................. JP2019-106712

(51) Int. Cl.
*H01L 27/06* (2006.01)
*H01L 29/06* (2006.01)
*H01L 29/78* (2006.01)
*H01L 29/739* (2006.01)
*H01L 29/10* (2006.01)

(52) U.S. Cl.
CPC ........ *H01L 27/0623* (2013.01); *H01L 29/063* (2013.01); *H01L 29/1095* (2013.01); *H01L 29/7397* (2013.01); *H01L 29/7802* (2013.01)

(58) Field of Classification Search
CPC ............... H01L 27/0623; H01L 29/063; H01L 29/7802; H01L 29/7397; H01L 29/1095; H01L 21/823481; H01L 21/823418; H01L 27/088; H01L 29/0834; H01L 29/0878; H01L 29/7811; H01L 29/0623; H01L 29/0619; H01L 29/4236; H01L 29/402; H01L 29/0684; H01L 29/42352; H01L 29/66613–66628; H01L 29/42356
See application file for complete search history.

(56) References Cited

U.S. PATENT DOCUMENTS

2010/0059028 A1\* 3/2010 Ueno .................. H01L 29/0696
123/652
2013/0248924 A1 9/2013 Matsudai et al.

FOREIGN PATENT DOCUMENTS

JP 2013-201237 A 10/2013

\* cited by examiner

*Primary Examiner* — Cuong B Nguyen
(74) *Attorney, Agent, or Firm* — Studebaker & Brackett PC

(57) ABSTRACT

A semiconductor device 1 has an IGBT region and a MOSFET region. A plurality of channel doped P layers formed in the MOSFET region include a trench-adjacent channel doped P layer whose side surface is in contact with a boundary trench gate formed between the IGBT region and the MOSFET region. A formation depth of the trench-adjacent channel doped P layer is set deeper than a formation depth of the boundary trench gate. In the MOSFET region, an N type MOSFET having a planar structure is configured including a channel region in the channel doped P layer, a gate insulating film in an interlayer oxide film, and a gate polysilicon serving as a planar gate.

6 Claims, 8 Drawing Sheets

SEMICONDUCTOR DEVICE

BACKGROUND OF THE INVENTION

Field of the Invention

The present invention relates to a semiconductor device including an IGBT region and a MOSFET region.

Description of the Background Art

In response to the market background of energy saving and miniaturization of apparatuses, further miniaturization of power devices from current ones is required for its achievement. Therefore, in some markets, a reverse-conducting IGBT (RC-IGBT) that integrates an IGBT and a diode has been applied to achieve miniaturization, and further loss reduction and improvement in performance thereof have been demanded currently. The RC-IGBT is disclosed in Japanese Patent Application Laid-Open No. 2013-201237, for example.

The RC-IGBT can downsize a power device as an integrated IGBT with a built-in diode. Therefore, market demands and expectations are increasing for further device miniaturization and further improvement in characteristics through the next generation and optimization of the RC-IGBT. In reducing total loss of the RC-IGBT, loss in an IGBT part is often dominant as compared to a diode part, and an area of a diode region of the RC-IGBT is to be designed smaller than that of an IGBT region. Reduction of the diode region leads to improvement of its current density. If thermal design and reliability are satisfactory, it is designed such that the current density of the diode is desirably increased for the purpose of securing the IGBT region.

Here, current concentration occurs as the diode region is reduced by optimization of the design of the diode part in the RC-IGBT, and there is a concern that breakdown tolerance is insufficient during a recovery operation when the diode switches from ON to OFF. Especially when lifetime control by heavy metal diffusion or a charged particle beam is performed for the purpose of speeding up by improving its recovery characteristics, there has been a problem of a case where expansion of the diode region or a substantial structural change is forced by generation of a surge voltage due to the speeding up of the recovery.

In addition, when a wafer is thinned for the purpose of reducing steady loss, a breakdown voltage on the diode side decreases, and a problem starts to occur in which a safe operating area (SOA) tolerance involved with the decrease in breakdown voltage on the diode side is significantly reduced. Furthermore, steady loss at a low current occurs due to a built-in voltage caused by a backside PN junction, during operation on the IGBT side. Therefore, there has been a situation where reduction of the loss is demanded.

A trench RC-IGBT disclosed in Japanese Patent Application Laid-Open No. 2013-201237 improves loss during operation on an IGBT side by changing a structure of a diode part, and suppresses a decrease in breakdown voltage due to electric field concentration in the diode part.

In a conventional RC-IGBT, a diode part is formed in a different region from an IGBT part, and is often formed with the same structure as the IGBT, basically from the viewpoint of loss reduction and easy production. That is, the conventional trench RC-IGBT has employed a PN junction with a trench cell structure by forming a P layer having a trench structure also in the diode part similarly to the IGBT part.

When the PN junction with the trench cell structure is employed in the diode part of the RC-IGBT, improvement of steady loss can be expected through reduction of a thickness on an effective $N^-$ substrate side. The steady loss of the diode means power loss in an ON state of flowing through the diode.

However, the P layer having the trench structure in the diode part of the RC-IGBT represented by Japanese Patent Application Laid-Open No. 2013-201237 has the following problems.

(1) Since a current flowing through the P layer having the trench structure does not function or contribute as a collector current on the IGBT side, it is not possible to improve the loss of the IGBT part.

(2) Since the P layer having the trench structure acts as an electric field concentration source, electric field concentration in the diode part causes a decrease in breakdown voltage.

SUMMARY

A semiconductor device capable of improving loss of an IGBT and suppressing a decrease in breakdown voltage is obtained.

A semiconductor device including an IGBT region having an IGBT inside and a MOSFET region having a MOSFET inside includes a semiconductor substrate having first and second main surfaces and a drift layer of a first conductivity type provided in the semiconductor substrate.

The IGBT region includes: a base layer of a second conductivity type provided in the semiconductor substrate and arranged adjacent on the first main surface side with respect to the drift layer; and a trench gate embedded via an insulating film in a region reaching a part of the drift layer from the first main surface side through the base layer.

The MOSFET region includes: a channel-containing region of a second conductivity type provided on the semiconductor substrate and selectively provided in an upper layer portion of the drift layer; and a MOS electrode region of a first conductivity type selectively provided in an upper layer portion of the channel-containing region, and at least a part of the upper layer portion of the channel-containing region where the MOS electrode region is not formed is defined as a channel region.

The MOSFET region further includes a planar gate provided on the channel region via a gate insulating film, and a MOSFET of the first conductivity type is configured including the channel region, the gate insulating film, and the planar gate.

The trench gate includes a boundary trench gate existing at a boundary between the IGBT region and the MOSFET region, and the channel-containing region includes a trench-gate adjacent region whose side surface is in contact with the boundary trench gate.

A formation depth of the trench-gate adjacent region is deeper than a formation depth of the boundary trench gate.

In the semiconductor device according to the present invention, since the formation depth of the trench-gate adjacent region is deeper than the formation depth of the boundary trench gate, electric field concentration that occurs immediately below a bottom end of the boundary trench gate can be mitigated by the trench-gate adjacent region.

Since the semiconductor device according to the present invention forms the MOSFET of a first conductivity type including the channel region, the gate insulating film, and the planar gate, the planar gate serves as a field plate, which makes it possible to improve a breakdown voltage in the MOSFET region.

In addition, the semiconductor device according to the present invention can operate as an RC-IGBT because a built-in diode formed by the channel-containing region and the drift layer can function in the MOSFET region when the MOSFET is not operating.

Furthermore, since the semiconductor device according to the present invention has the MOSFET in the MOSFET region, it is possible to improve power loss during IGBT operation in a low current region.

These and other objects, features, aspects and advantages of the present invention will become more apparent from the following detailed description of the present invention when taken in conjunction with the accompanying drawings.

DESCRIPTION OF PREFERRED EMBODIMENTS

<Introduction>

Figure 1:
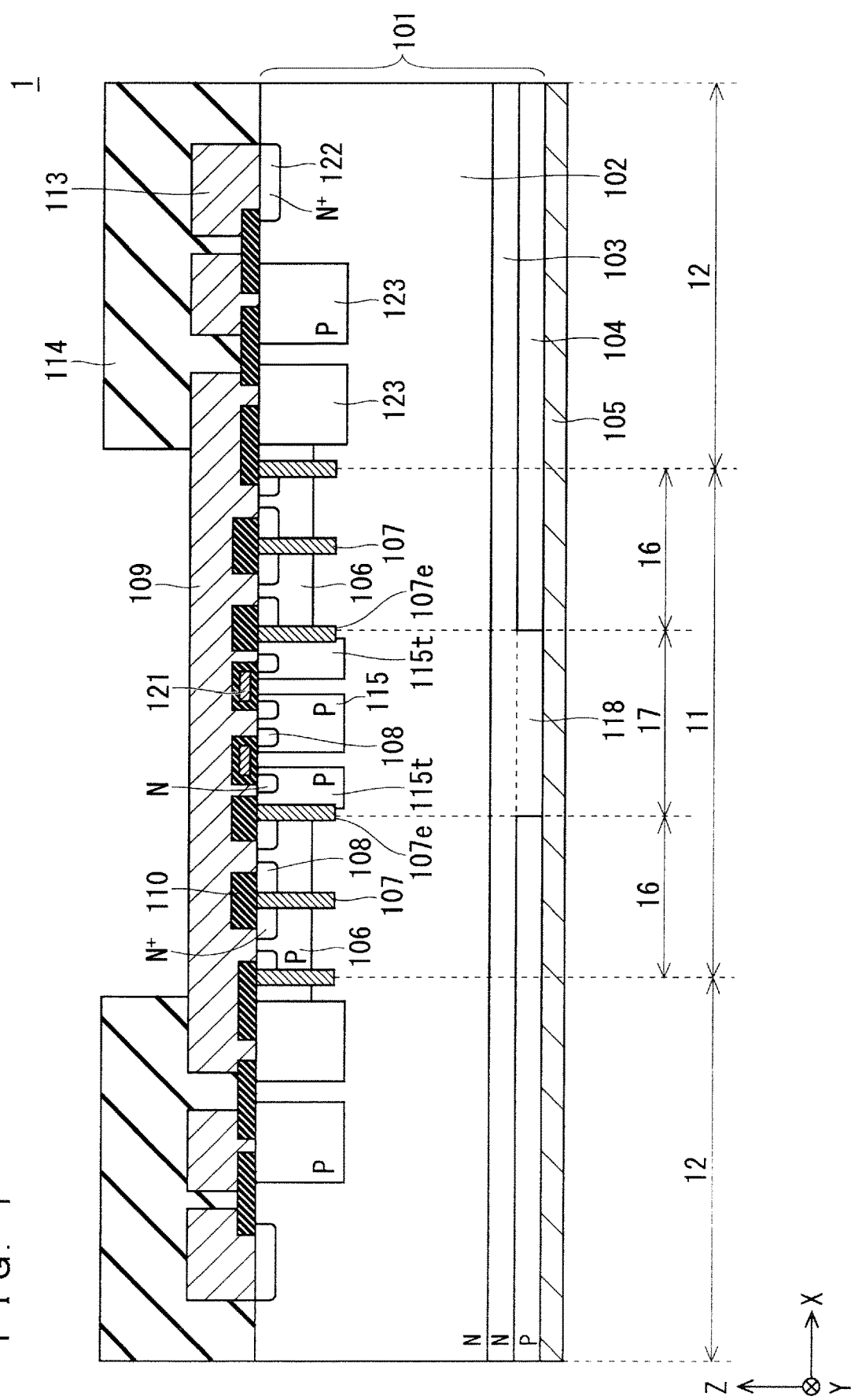
FIG. 1 is a cross-sectional view showing a structure of a semiconductor device according to a first preferred embodiment of the present invention.

Hereinafter, first to fourth preferred embodiments will be described with reference to the attached drawings. Since the drawings are schematically shown, the mutual relationship between a size and a position can be appropriately changed. In the following description, the same or corresponding components may be given the same reference numerals, and repeated description may be omitted. A conductivity type of a semiconductor will be described with a first conductivity type being an N type and a second conductivity type being a P type. However, by inverting these, the first conductivity type may be the P type and the second conductivity type may be the N type. An $N^+$ type means that a donor impurity concentration is higher than that of the N type, and an $N^-$ type means the donor impurity concentration is lower than that of the N type. Similarly, a $P^+$ type means an acceptor impurity concentration is higher than that of the P type, and a $P^-$ type means that the acceptor impurity concentration is lower than that of the P type.

The term "MOS" has been used for a layered structure of metal/oxide/semiconductor in the old days and is supposed to be an acronym for "Metal-Oxide-Semiconductor". However, particularly in a field effect transistor having a MOS structure (hereinafter simply referred to as "MOSFET"), materials for gate insulating films and gate electrodes have been improved from the viewpoint of integration and improvement of manufacturing processes in recent years.

For example, in the MOSFET, polycrystalline silicon has been adopted instead of metal as a material for a gate electrode, mainly from the viewpoint of forming a source/channel doped layer in a self-alignment manner. Further, from the viewpoint of improving electrical characteristics, a high dielectric constant material is adopted as a material for a gate insulating film, but the material is not necessarily limited to an oxide.

Therefore, the term "MOS" is not necessarily limited to the layered structure of metal/oxide/semiconductor to be adopted, and such limitation is not presumed in this specification. That is, in view of the common general knowledge, in addition to being as the abbreviation derived from origin of the word, "MOS" here has meaning also broadly including a conductor/insulator/semiconductor laminated structure.

First Preferred Embodiment

FIG. 1 is across-sectional view showing a structure of a semiconductor device 1 according to a first preferred embodiment of the present invention. The semiconductor device 1 of the first preferred embodiment is an RC-IGBT. FIG. 1 shows an XYZ orthogonal coordinate system. FIGS. 2 and 4 to 8 described later also show the XYZ orthogonal coordinate system.

The semiconductor device 1 includes a silicon substrate 101 that is a semiconductor substrate. The silicon substrate 101 has a front surface that is a first main surface on the +Z direction side, and a back surface that is a second main surface on the −Z direction side and opposed to the first main surface.

The silicon substrate 101 has an emitter cell part 11 and an edge termination part 12. The emitter cell part 11 is classified into an IGBT region 16 and a MOSFET region 17. In plan view of the semiconductor device 1, the edge termination part 12 is arranged around the emitter cell part 11.

In the entire silicon substrate 101, an N type drift layer 102 and an N type buffer layer 103 are provided in the silicon substrate 101, in which the N type is a first conductivity type. The N type buffer layer 103 is provided on a back surface side of the silicon substrate 101 with respect to the N type drift layer 102.

In the IGBT region 16 of the emitter cell part 11 and the edge termination part 12, a P type collector layer 104 is provided on a back surface side of the N type buffer layer 103.

Hereinafter, the IGBT region 16 in the emitter cell part 11 will be described.

A P type channel doped P layer 106, in which the P type is a second conductivity type, is provided as an IGBT base layer in an upper layer portion of the drift layer 102.

That is, the channel doped P layer 106 as the base layer is selectively arranged adjacent on the front surface side of the silicon substrate 101 with respect to the drift layer 102, in the IGBT region 16.

An $N^+$ type source region 108 is selectively provided in an upper layer portion of the channel doped P layer 106.

Further, from the front surface side of the silicon substrate 101 through the source region 108 and the channel doped P layer 106, a trench gate 107 is buried via an insulating film (not shown) in a region reaching a part of the drift layer 102. Although not shown in FIGS. 1, 2, and 4 to 8, the trench gate 107 is a gate electrode embedded via the insulating film.

As a back surface structure of the silicon substrate 101, the N type buffer layer 103, the P type collector layer 104, and a collector electrode 105 are provided.

The buffer layer 103 is provided on a lower surface of the drift layer 102, and the P type collector layer 104 is provided on a lower surface of the buffer layer 103. Further, the collector electrode 105 is provided on a lower surface of the collector layer 104.

The IGBT region 16 extends from the front surface to the back surface of the silicon substrate 101. The MOSFET region 17 is provided adjacent to the IGBT region 16. In the structure shown in FIG. 1, the MOSFET region 17 is provided between two IGBT regions 16.

Next, the MOSFET region 17 in the emitter cell part 11 will be described.

In the upper layer portion of the drift layer 102, a plurality of channel doped P layers 115 that are discrete from each other are selectively provided. Each of the plurality of channel doped P layers 115 serves as a P type channel-containing region.

Further, the N$^+$ type source region 108 is selectively provided in an upper layer portion of each of the plurality of channel doped P layers 115. In the MOSFET region 17, the source region 108 functions as a MOS electrode region. The source region 108 of the IGBT region 16 and the source region 108 of the MOSFET region 17 can be formed simultaneously.

Then, between one channel doped P layer 115 and another channel doped P layer 115 adjacent to each other, a gate polysilicon 121 is selectively provided via an interlayer oxide film 110 above one channel doped P layer 115 where the source region 108 is not formed, the drift layer 102 where the channel doped P layer 115 is not formed, and another channel doped P layer 115 where the source region 108 is not formed.

Therefore, a part of an upper layer portion of one and another channel doped P layers 115 where the source region 108 is not formed is defined as a channel region, and the interlayer oxide film 110 formed on the channel region functions as a gate insulating film.

Thus, the gate polysilicon 121 provided on the channel region via the gate insulating film functions as a planar gate of the MOSFET.

That is, an N type MOSFET is configured by the upper layer portion of the drift layer 102 where the source region 108 and the channel doped P layer 115 are not formed, in addition to the channel region, the gate insulating film, and the gate polysilicon 121.

At a boundary between the IGBT region 16 and the MOSFET region 17, the trench gate 107 is provided. Hereinafter, the trench gate 107 provided at the boundary between the IGBT region 16 and the MOSFET region 17 may be referred to as "boundary trench gate 107e".

As described above, a plurality of the trench gates 107 provided in the IGBT region 16 include the boundary trench gate 107e.

Whereas, among the plurality of channel doped P layers 115, there is a channel doped P layer 115 whose side surface is in contact with the boundary trench gate 107e in the IGBT region 16. Hereinafter, among the plurality of channel doped P layers 115, the channel doped P layer 115 whose side surface is in contact with the boundary trench gate 107e may be referred to as "trench-adjacent channel doped P layer 115t".

As described above, the plurality of channel doped P layers 115 provided in the MOSFET region 17 include the trench-adjacent channel doped P layer 115t serving as a trench-gate adjacent region.

Then, the semiconductor device 1 of the first preferred embodiment has a feature that a formation depth of the trench-adjacent channel doped P layer 115t is deeper than a formation depth of the boundary trench gate 107e. In the first preferred embodiment, the plurality of channel doped P layers 115 are all formed at a same depth.

Further, the MOSFET region 17 contains a diode by a PN junction between the channel doped P layer 115 and the drift layer 102. Therefore, the semiconductor device 1 can operate as an RC-IGBT in which the IGBT and the diode are in antiparallel, by the IGBT formed in the IGBT region 16 and the built-in diode formed in the MOSFET region 17.

As the back surface structure of the silicon substrate 101, the buffer layer 103, an N type cathode layer 118 that also functions as a drain, and the collector electrode 105 are formed.

The buffer layer 103 is provided on the lower surface of the drift layer 102, and the N type cathode layer 118 is provided on the lower surface of the buffer layer 103. Further, the collector electrode 105 is provided on a lower surface of the cathode layer 118.

Next, the edge termination part 12 will be described.

An outer peripheral P well 123 is selectively provided in an upper layer portion of the drift layer 102, and the outer peripheral P well 123 functions as a guard ring. However, without limiting to the guard ring, the edge termination part 12 may have a structure in which a concentration gradient of one P well is changed, such as a variation lateral doping (VLD) structure.

Further, an N$^+$ diffusion layer 122 is selectively provided in the upper layer portion of the drift layer 102, and an edge termination aluminum electrode 113 is provided on the N$^+$ diffusion layer 122. By setting the edge termination aluminum electrode 113 to a same potential as the cathode layer 118 to set the drift layer 102 and the edge termination aluminum electrode 113 to a same potential, a depletion layer spreads and shares a voltage also in the edge termination part 12 of the drift layer 102 in addition to a vertical direction (−Z direction) of the drift layer 102, when a high voltage is applied between the collector electrode 105 and an emitter aluminum electrode 109. This makes it possible to maintain a breakdown voltage by the edge termination part 12.

Further, in the edge termination part 12, similarly to the IGBT region 16, the buffer layer 103 is provided on the lower surface of the drift layer 102, and the collector layer 104 is provided on the lower surface of the buffer layer 103. Further, the collector electrode 105 is provided on the lower surface of the collector layer 104. Here, as an example, a bottom layer of the silicon substrate 101 in the edge termination part 12 is the collector layer 104, but may be the same cathode layer 118 as the bottom layer of the silicon substrate 101 in the MOSFET region 17, for the purpose of improving a breakdown voltage and the like.

Therefore, the drift layer 102, the buffer layer 103, and the collector electrode 105 are shared by the IGBT region 16, the MOSFET region 17, and the edge termination part 12. The collector layer 104 is shared by the IGBT region 16 and the edge termination part 12. Further, the cathode layer 118 is provided for the MOSFET region 17.

As described above, the silicon substrate 101 has the emitter cell part 11 that is classified into the IGBT region 16 and the MOSFET region 17, and the edge termination part 12.

On a front surface of the silicon substrate 101, the interlayer oxide film 110 is selectively formed. The interlayer oxide film 110 is provided so as to cover a part of the source region 108 from a front surface of the trench gate 107 in the IGBT region 16. Further, the interlayer oxide film 110 is provided so as to cover a front surface, a back surface, and a side surface of the gate polysilicon 121 in the MOSFET region 17, and is provided on the drift layer 102, on a part of the channel doped P layer 115, and on a part of the $N^+$ type source region 108.

Furthermore, the interlayer oxide film 110 is formed on a part of a front surface of the outer peripheral P well 123 in the edge termination part 12, a part of a front surface of the $N^+$ diffusion layer 122, and a part of a front surface of the drift layer 102, and is provided such that a part of the front surfaces of the outer peripheral P well 123 and the $N^+$ diffusion layer 122 is exposed.

In the IGBT region 16 and the MOSFET region 17, the emitter aluminum electrode 109 is provided on the entire surface of the silicon substrate 101 via the interlayer oxide film 110, and extends on a part of the outer peripheral P well 123 of the edge termination part 12.

The emitter aluminum electrode 109 is provided in contact with a part of a front surface of the source region 108 in the IGBT region 16. Therefore, in the IGBT region 16, the emitter aluminum electrode 109 and the source region 108 are electrically connected.

The emitter aluminum electrode 109 is provided so as to be in contact with a part of the front surface of the source region 108, which is the MOS electrode region in the MOSFET region 17. Therefore, in the IGBT region 16, the emitter aluminum electrode 109 and the source region 108 are electrically connected.

The emitter aluminum electrode 109 is selectively provided on the silicon substrate 101 via the interlayer oxide film 110 in the edge termination part 12.

The emitter aluminum electrode 109 is provided in contact with a part of the front surface of the outer peripheral P well 123 in the edge termination part 12. Therefore, in the edge termination part 12, the emitter aluminum electrode 109 and a part of the outer peripheral P well 123 are electrically connected.

The edge termination aluminum electrode 113 is selectively provided on the silicon substrate 101 via the interlayer oxide film 110 in the edge termination part 12.

The edge termination aluminum electrode 113 is provided in contact with a part of the front surface of the $N^+$ diffusion layer 122 in the edge termination part 12. Therefore, in the edge termination part 12, the edge termination aluminum electrode 113 and the $N^+$ diffusion layer 122 are electrically connected.

In the edge termination part 12, an edge termination/insulating film 114 is provided on the entire surface including the emitter aluminum electrode 109 and the interlayer oxide film 110.

In the IGBT region 16, an IGBT is configured including the above-described emitter aluminum electrode 109, source region 108, channel doped P layer 106, drift layer 102, buffer layer 103, collector layer 104, collector electrode 105, and trench gate 107 as main components.

Hereinafter, an operation when the IGBT is ON will be described. The IGBT is a bipolar element that operates by electron carriers and hole carriers. When the IGBT is ON, an N type trench MOS gate structure including the channel doped P layer 106, the source region 108, and the trench gate 107 becomes conductive. Meanwhile, as described above, an insulating film (not shown) is formed around the trench gate 107, and a part of this insulating film functions as a gate insulating film of the trench MOS gate structure.

Then, in the IGBT region 16, a current flows through a path of the collector layer 104, the buffer layer 103, the drift layer 102, the channel doped P layer 106, and the source region 108.

As described above, in the IGBT region 16, a plurality of trench MOS gate structures each including the channel doped P layer 106, the source region 108, and the trench gate 107 are formed.

In such a configuration, the IGBT operates by applying a positive voltage to the trench gate 107, and applying a positive voltage to the collector electrode 105 while forming an N type channel region in a part of the channel doped P layer 106.

The IGBT reduces ON-resistance by accumulating electron carriers and hole carriers in the drift layer 102 during operation and causing conductivity modulation. In order to lower the ON-voltage of the IGBT, it is necessary to increase the carrier accumulation effect.

Next, an operation when the MOSFET having the planar gate structure formed in the MOSFET region 17 is ON will be described. The MOSFET has an N type MOS gate structure having a planar structure including the channel doped P layer 115, the source region 108, the gate insulating film that is a part of the interlayer oxide film 110, the gate polysilicon 121, and the drift layer 102 as main components.

In the MOSFET region 17, the electron carriers flow from the emitter aluminum electrode 109 to the collector electrode 105 via the source region 108, the N type channel region in the channel doped P layer 115, the drift layer 102, the buffer layer 103, and the cathode layer 118.

Further, the MOSFET includes a built-in diode including the channel doped P layer 115 and the drift layer 102. Therefore, when a positive voltage is applied to the emitter aluminum electrode 109 with a zero or negative voltage applied to the gate polysilicon 121, hole carriers are injected from the channel doped P layer 106 into the drift layer 102, and electron carriers are injected into the drift layer 102 from the cathode layer 118.

Then, the built-in diode is brought into an ON state when an applied voltage becomes the built-in voltage or more of the built-in diode. Here, the applied voltage means a voltage applied between the emitter aluminum electrode 109 with an emitter side set to +, and the collector electrode 105. Thus, in the MOSFET region 17, when the gate polysilicon 121 that is the planar gate is not applied with a positive voltage to an extent that a channel is formed in the channel doped P layer 115 immediately below, the built-in diode can be effectively operated.

In the MOSFET region 17, when the built-in diode is brought into the ON state, a current flows through a path of the emitter aluminum electrode 109, the channel doped P layer 115, the drift layer 102, the buffer layer 103, the cathode layer 118, and the collector electrode 105.

As described above, in the semiconductor device 1 of the first preferred embodiment, the formation depth of the trench-adjacent channel doped P layer 115$t$ is set deeper than the formation depth of the boundary trench gate 107$e$.

Therefore, the semiconductor device 1 can mitigate electric field concentration generated immediately below a bottom end of the boundary trench gate 107$e$, by the trench-adjacent channel doped P layer 115$t$.

This is because a part of the bottom end of the trench gate 107 can be covered with the trench-adjacent channel doped P layer 115t.

Alternatively, a modified example is also conceivable in which the formation depth of the trench-adjacent channel doped P layer 115t is set to be the same as a formation depth of the outer peripheral P well 123 provided in the edge termination part 12. In this modified example, since the outer peripheral P well 123 and the channel doped P layer 115 can be formed simultaneously, there is an advantage that it is possible to simplify a series of manufacturing processes including a photoengraving process and an implantation process of an impurity serving as a dopant.

In the semiconductor device 1, the N type MOSFET having a planar structure is configured including the channel region in the channel doped P layer 115, the gate insulating film in the interlayer oxide film 110, and the gate polysilicon 121 serving as a planar gate described above. Therefore, mainly when the MOSFET having a planar structure is not operated, the gate polysilicon 121 serves as a field plate, enabling improvement of a breakdown voltage in the MOSFET region 17. Note that the time when the MOSFET is not operating corresponds to an OFF state and a part of a switching transition period.

That is, in the semiconductor device 1 of the first preferred embodiment, a planar MOS gate structure including the gate insulating film of the interlayer oxide film 110 and the gate polysilicon 121 is added, for electric field concentration that is likely to occur at a curved diffusion part interface formed by thermal diffusion of the channel doped P layer 115 between the channel doped P layers 115 and 115 adjacent to each other. Therefore, the breakdown voltage in the MOSFET region 17 can be improved by the gate polysilicon 121 serving as a field plate as described above.

Further, in the MOSFET region 17, the semiconductor device 1 can cause the built-in diode configured by the channel doped P layer 115, which is the channel-containing region, and the drift layer 102, to function when the MOSFET is not operating. Therefore, the semiconductor device 1 can operate as the RC-IGBT.

Furthermore, since the semiconductor device 1 has the MOSFET in the MOSFET region 17, it is possible to improve power loss during IGBT operation in a low current region.

Figure 2:
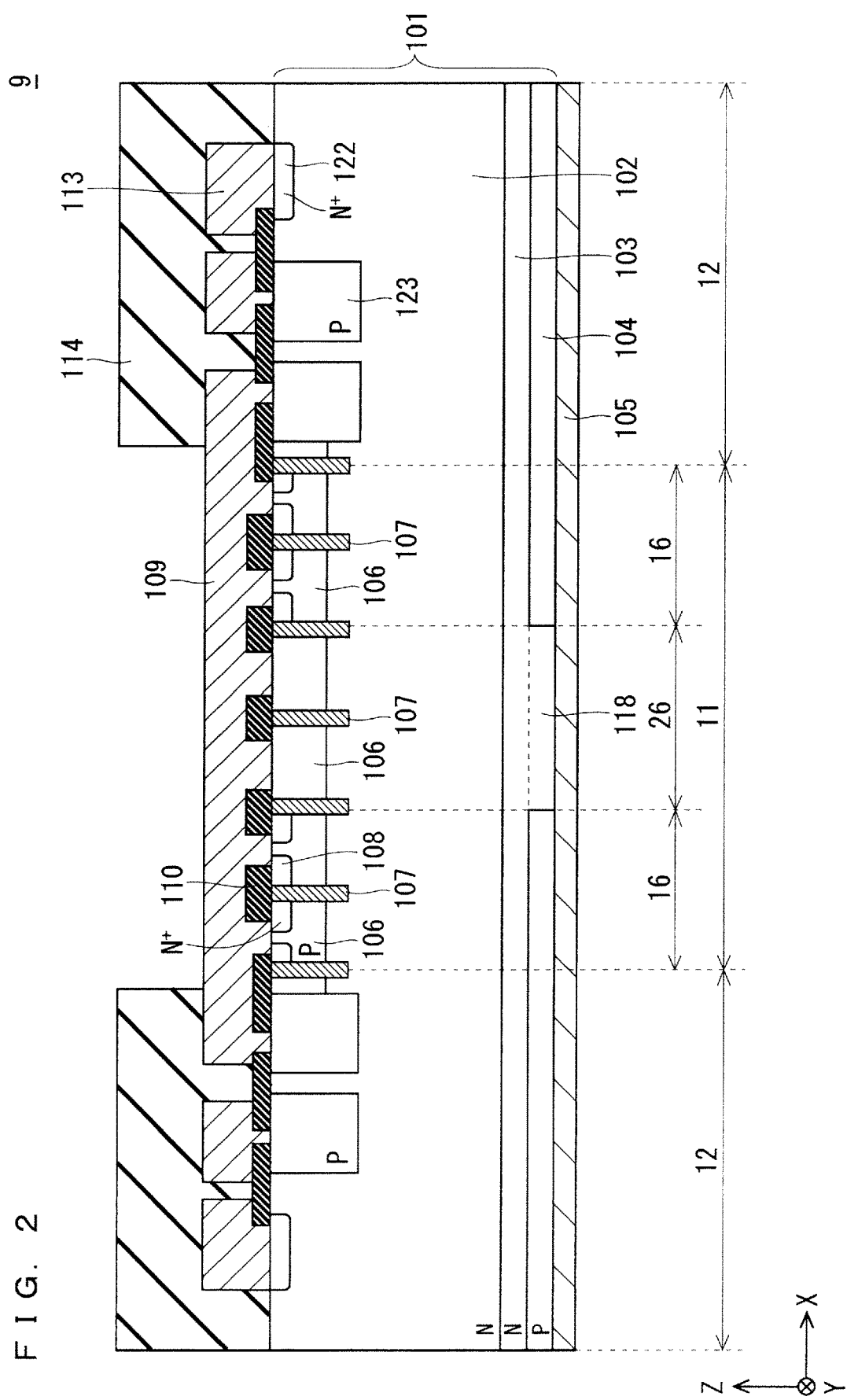
FIG. 2 is a cross-sectional view showing a structure of a conventional semiconductor device for comparison according to the first preferred embodiment.
Figure 3:
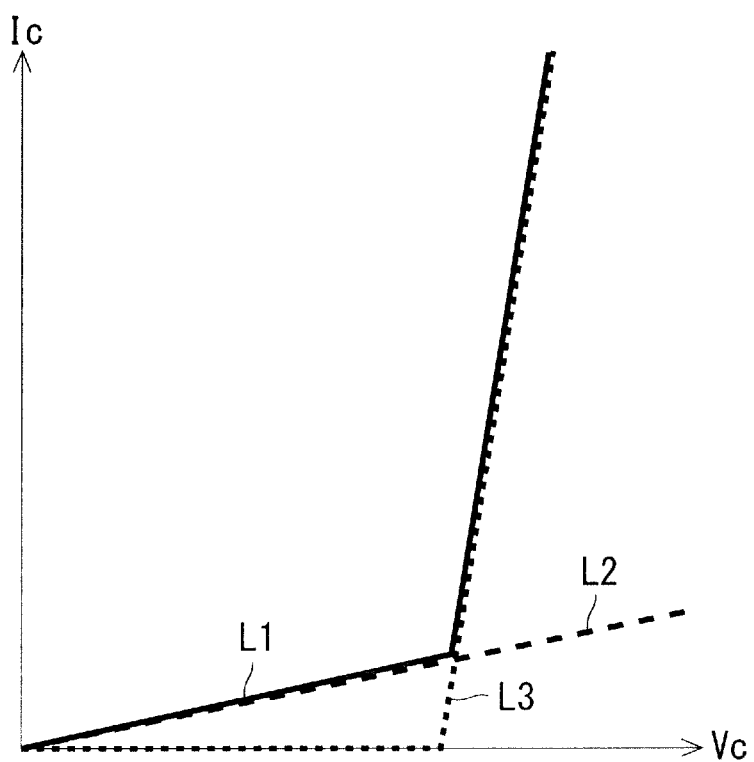
FIG. 3 is a waveform chart showing output characteristics of the semiconductor device according to the first preferred embodiment.

This point will be described in detail below. FIG. 2 is a cross-sectional view showing a structure of a conventional semiconductor device 9 for comparison according to the first preferred embodiment. FIG. 3 is a waveform chart showing output characteristics of the semiconductor device 1 according to the first preferred embodiment.

As shown in FIG. 2, a channel doped P layer 106 and a trench gate 107 are formed in common in an IGBT region 16 and a diode region 26, for reasons such as simplifying a manufacturing process. Then, in the diode region 26, the channel doped P layer 106 and a drift layer 102 form a diode. Therefore, no MOSFET exists in the diode region 26.

Therefore, in the conventional semiconductor device 9 shown in FIG. 2, the IGBT does not operate in a low current region where a collector voltage Vc is relatively low, and therefore a collector current Ic does not flow as shown in an output waveform L3 of FIG. 3.

Whereas, in the semiconductor device 1 of the first preferred embodiment, as shown in an output waveform L1 of FIG. 3, the collector current Ic also flows in the low current region, similarly to an output waveform L2 of the MOSFET.

Then, in the semiconductor device 1 of the first preferred embodiment, the collector current Ic flows in a high current region where the collector voltage Vc is relatively high, similarly to the output waveform L3 of the IGBT, as indicated by the output waveform L1 of FIG. 3.

Thus, as shown in FIG. 3, the output waveform L1 in the semiconductor device 1 of the first preferred embodiment matches the output waveform L2 of the MOSFET in the low current region, and matches the output waveform L3 of the IGBT in the high current region.

Furthermore, in the semiconductor device 1 of the first preferred embodiment, the region on the drift layer 102 side can be substantially expanded when optimum design is made by forming a plurality of channel doped P layers 115 separately from each other in the MOSFET region 17. That is, a volume to be the region of the drift layer 102 can be increased by an amount of the region where the channel doped P layer 115 does not exist, and the breakdown voltage of the MOSFET region 17 can be improved.

Particularly in recent years, the silicon substrate 101 is thinned, that is, the drift layer 102 is thinned to reduce power loss of power devices such as IGBTs. However, as a contradiction, a decrease in breakdown voltage becomes a problem. Therefore, by separately forming a plurality of channel doped P layers 115 in the MOSFET region 17, it is possible to suppress a decrease in breakdown voltage due to electric field concentration.

Meanwhile, as a contradiction to the formation of the channel doped P layer 115 having a relatively deep formation depth, an increase in recovery loss is assumed, which is a characteristic during operation of the built-in diode. As countermeasures against this recovery loss, existing lifetime control by heavy metal diffusion or a charged particle beam can be considered, and deterioration of the recovery loss can be suppressed by appropriately performing this lifetime control.

Second Preferred Embodiment

Figure 4:
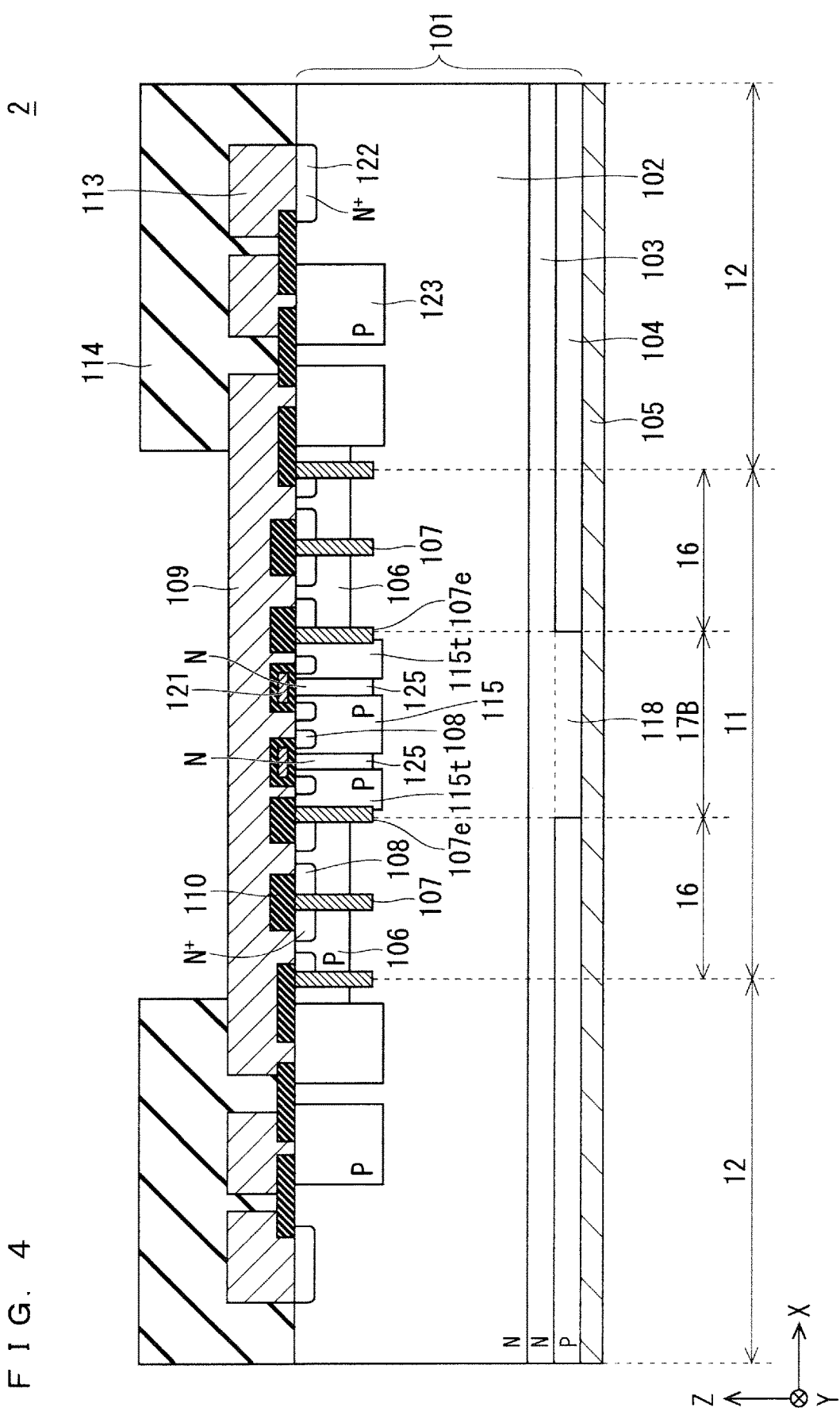
FIG. 4 is a cross-sectional view showing a structure of a semiconductor device according to a second preferred embodiment of the present invention.

FIG. 4 is a cross-sectional view showing a structure of a semiconductor device 2 according to a second preferred embodiment of the present invention. The semiconductor device 2 of the second preferred embodiment is an RC-IGBT, similarly to the first preferred embodiment.

In the following, characteristics of the semiconductor device 2 of the second preferred embodiment will be mainly described, and structures and operations similar to those in the first preferred embodiment will be denoted by the same reference numerals, and description thereof will be omitted as appropriate.

The semiconductor device 2 has an emitter cell part 11 classified into an IGBT region 16 and a MOSFET region 17B.

In the MOSFET region 17B, a plurality of N type diffusion layers 125 are provided discretely from each other in an upper layer portion of a drift layer 102 between a plurality of channel doped P layers 115, which are a plurality of channel-containing regions. The plurality of N type diffusion layers 125 serve as at least one upper diffusion region. That is, one N type diffusion layer 125 is provided between a pair of mutually adjacent channel doped P layers 115 among the plurality of channel doped P layers 115 provided discretely from each other.

In the MOSFET region 17B, an N type MOSFET is configured by a source region 108 and the N type diffusion layer 125, in addition to a part of a channel region of the channel doped P layer 115, a part of a gate insulating film of an interlayer oxide film 110, and the gate polysilicon 121. Note that the channel region and the gate insulating film are similar to those of the semiconductor device 1 of the first preferred embodiment.

The semiconductor device 2 of the second preferred embodiment having the above-described configuration has a trench-adjacent channel doped P layer 115t, similarly to the semiconductor device 1 of the first preferred embodiment, and therefore has effects similar to those of the first preferred embodiment.

Further, the plurality of N type diffusion layers 125 in the semiconductor device 2 of the second preferred embodiment have the following features (1) and (2).

(1) The plurality of N type diffusion layers 125 are set to have a higher N type impurity concentration than that of the drift layer 102.

(2) A formation depth of the plurality of N type diffusion layers 125 is shallower than a formation depth of the plurality of channel doped P layers 115, which are the plurality of channel-containing regions.

In the second preferred embodiment, by having the above feature (1), it is possible to lower a J-FET resistance between the channel doped P layers 115 and 115 adjacent to each other in the MOSFET region 17B, to reduce ON-state resistance of the MOSFET.

Furthermore, in the semiconductor device 2 of the second preferred embodiment, since the above-described feature (1) can reduce the ON-state resistance in the MOSFET, a distance between adjacent channel doped P layers 115 and 115 can be shortened in the plurality of channel doped P layers 115 to improve a breakdown voltage.

Therefore, in the semiconductor device 2 of the second preferred embodiment, trade-off itself between the ON-resistance and the breakdown voltage of the MOSFET region 17B tends to be improved as compared to the first preferred embodiment. Therefore, it is possible to design the MOSFET region 17B having the same breakdown voltage and lower ON-resistance in the second preferred embodiment.

As a result, the MOSFET region 17B has a built-in diode, and an effective region of the MOSFET can be made wider than that in the first preferred embodiment.

In addition, in the semiconductor device 2 of the second preferred embodiment, by having the above feature (2), it is possible to suppress a formation region of the plurality of N type diffusion layers 125 to the minimum necessary, and suppress a decrease in breakdown voltage of the MOSFET region 17B due to the N type diffusion layer 125.

Third Preferred Embodiment (Basic Example)

Figure 5:
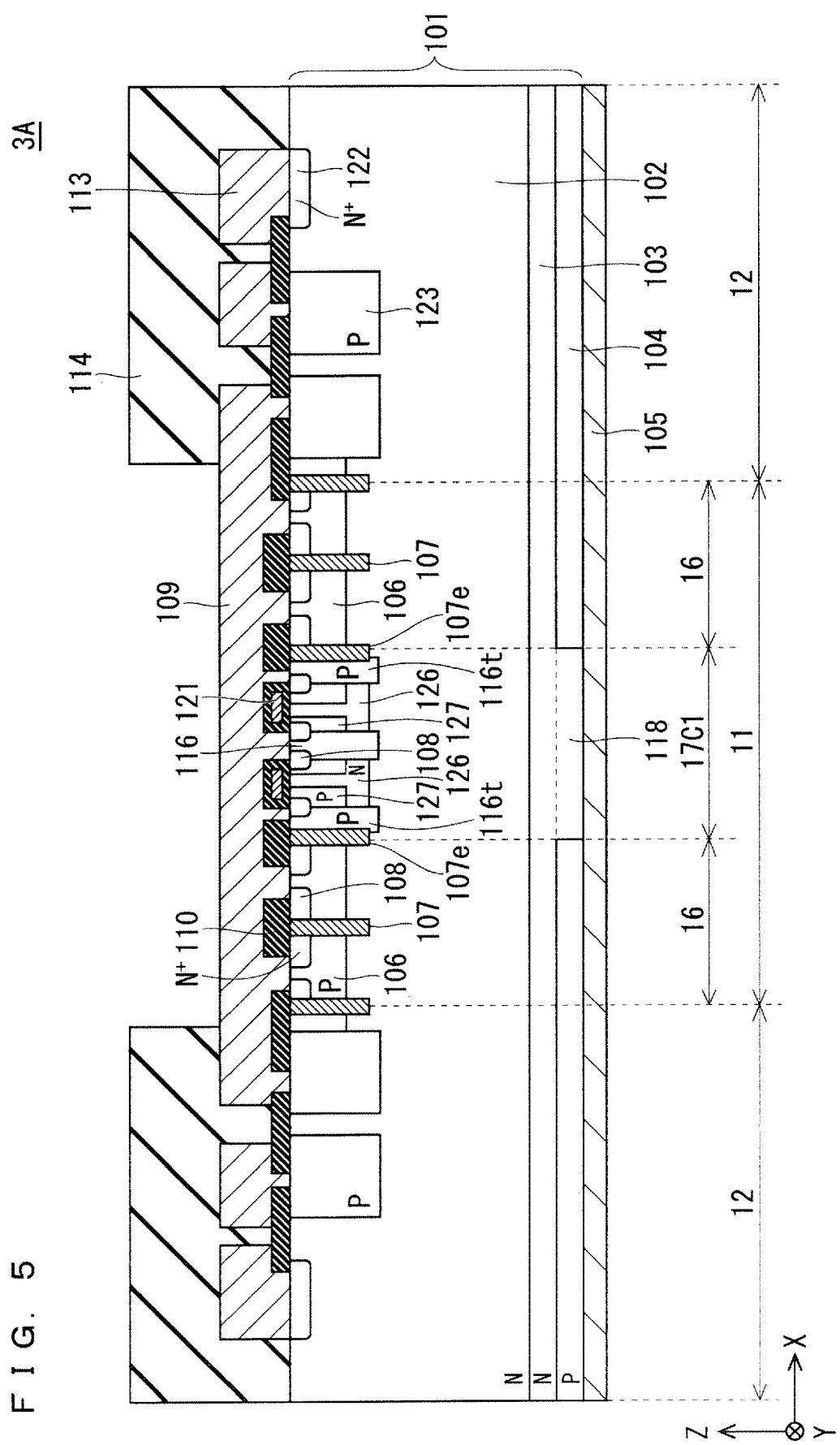
FIG. 5 is a cross-sectional view showing a structure of a semiconductor device as a basic example according to a third preferred embodiment of the present invention.

FIG. 5 is a cross-sectional view showing a structure of a semiconductor device 3A as a basic example according to a third preferred embodiment of the present invention. The semiconductor device 3A of the third preferred embodiment is an RC-IGBT, similarly to the first preferred embodiment.

In the following, characteristics of the semiconductor device 3A of the third preferred embodiment will be mainly described, and structures and operations similar to those in the first preferred embodiment will be denoted by the same reference numerals, and description thereof will be omitted as appropriate.

The semiconductor device 3A has an emitter cell part 11 classified into an IGBT region 16 and a MOSFET region 17C1. Hereinafter, a structure of the MOSFET region 17C1 will be described.

In an upper layer portion of a drift layer 102, a plurality of channel doped P layers 116 are selectively provided discretely from each other. In the upper layer portion of the drift layer 102, a plurality of second channel doped P layers 127 separated from each other are selectively provided.

Then, P type impurity concentration of the plurality of second channel doped P layers 127 is set lower than impurity concentration of the channel doped P layer 116. Further, a formation depth of the plurality of second channel doped P layers 127 is shallower than a formation depth of the plurality of channel doped P layers 116.

The plurality of channel doped P layers 116 and the plurality of second channel doped P layers 127 are provided in a one-to-one relationship. Corresponding channel doped P layer 116 and second channel doped P layer 127 are in contact with each other at side surfaces to form a combination channel doped P layer. The plurality of combination channel doped P layers serve as channel-containing regions provided discretely from each other.

That is, each of the plurality of channel doped P layers 116 serves as a first partial diffusion region, each of the plurality of second channel doped P layers 127 serves as a second partial diffusion region, and a channel-containing region is formed by a combination of the first and second partial diffusion regions.

Therefore, in the semiconductor device 3A as the basic example of the third preferred embodiment, the plurality of combination channel doped P layers described above are selectively provided in an upper layer portion of the silicon substrate 101.

Further, in an upper layer portion of each of the plurality of combination channel doped P layers, an N type source region 108, which is a MOS electrode region, is selectively provided. Specifically, the source region 108 is formed from an upper layer portion of the channel doped P layer 116 to an upper layer portion of the second channel doped P layer 127.

Further, a plurality of N type diffusion layers 126 are provided in the upper layer portion of the drift layer 102 between the plurality of combination channel doped P layers, which are the plurality of channel-containing regions. The plurality of N type diffusion layers 126 serve as at least one upper diffusion region.

Note that a formation depth of the N type diffusion layer 126 is deeper than a formation depth of the second channel doped P layer 127 and shallower than a formation depth of the channel doped P layer 116. Specifically, a pair of second channel doped P layers 127 are selectively formed in an upper layer portion of the N type diffusion layer 126, and the N type diffusion layer 126 is formed to extend from a region between the second channel doped P layers 127 and 127 to a region below the second channel doped P layers 127 and 127.

In the MOSFET region 17C1, an N type MOSFET is configured by the source region 108 and the N type diffusion layer 126, in addition to a part of a channel region of the second channel doped P layer 127, a part of a gate insulating film of an interlayer oxide film 110, and a gate polysilicon 121. Note that the channel region is an upper layer region of the second channel doped P layer 127 where the source region 108 is not formed, below the gate polysilicon 121. Further, the gate insulating film is similar to that of the semiconductor device 1 of the first preferred embodiment.

Whereas, the plurality of channel doped P layers 116 include a channel doped P layer 116 whose side surface is in contact with a boundary trench gate 107e in the IGBT region 16. Hereinafter, the channel doped P layer 116 whose side surface is in contact with the boundary trench gate 107e may be referred to as "trench-adjacent channel doped P layer 116t".

As described above, the plurality of channel doped P layers 116 provided in the MOSFET region 17C1 include the trench-adjacent channel doped P layer 116t serving as a trench-gate adjacent region. That is, a plurality of first partial diffusion regions include the trench-gate adjacent region.

The semiconductor device 3A as the basic example of the third preferred embodiment has a feature that a formation depth of the trench-adjacent channel doped P layer 116t is deeper than a formation depth of the boundary trench gate 107e.

Further, the MOSFET region 17C1 contains a diode by mainly a PN junction between the channel doped P layer 116 and the drift layer 102. Therefore, the semiconductor device 3A can operate as an RC-IGBT in which an IGBT and a diode are in antiparallel, by an IGBT formed in the IGBT region 16 and a built-in diode formed in the MOSFET region 17C1.

The plurality of channel doped P layers 116 in the semiconductor device 3A having the above-described configuration as the basic example of the third preferred embodiment have the trench-adjacent channel doped P layer 116t corresponding to the trench-adjacent channel doped P layer 115t of the semiconductor device 1 of the first preferred embodiment. Therefore, effects similar to those of the first preferred embodiment can be obtained.

In addition, the N type diffusion layer 126 of the semiconductor device 3A has a feature similar to the features (1) and (2) of the N type diffusion layer 125 of the semiconductor device 2 of the second preferred embodiment. Therefore, effects similar to those of the second preferred embodiment can be obtained.

Furthermore, in the semiconductor device 3A as the basic example of the third preferred embodiment, the plurality of channel doped P layers 116 and the plurality of second channel doped P layers 127 have the following feature (3).

(3) The second channel doped P layer 127 is formed in contact with the channel doped P layer 116 at a side surface, and a formation depth of the second channel doped P layer 127 is shallower than a formation depth of the channel doped P layer 116.

The semiconductor device 3A of the third preferred embodiment has the above feature (3), and the presence of the second channel doped P layer 127, which is the second partial diffusion region, can mitigate electric field concentration at a curved diffusion part interface formed by thermal diffusion of the channel doped P layer 116, which is a corresponding first partial diffusion region.

Hereinafter, this point will be described. Electric field concentration is likely to occur due to a curved diffusion part interface formed by thermal diffusion of the channel doped P layer 116. Therefore, by arranging the second channel doped P layer 127 that is shallower than the channel doped P layer 116 adjacent to the channel doped P layer 116, the above-described electric field concentration can be mitigated.

(Modified Example)

Figure 6:
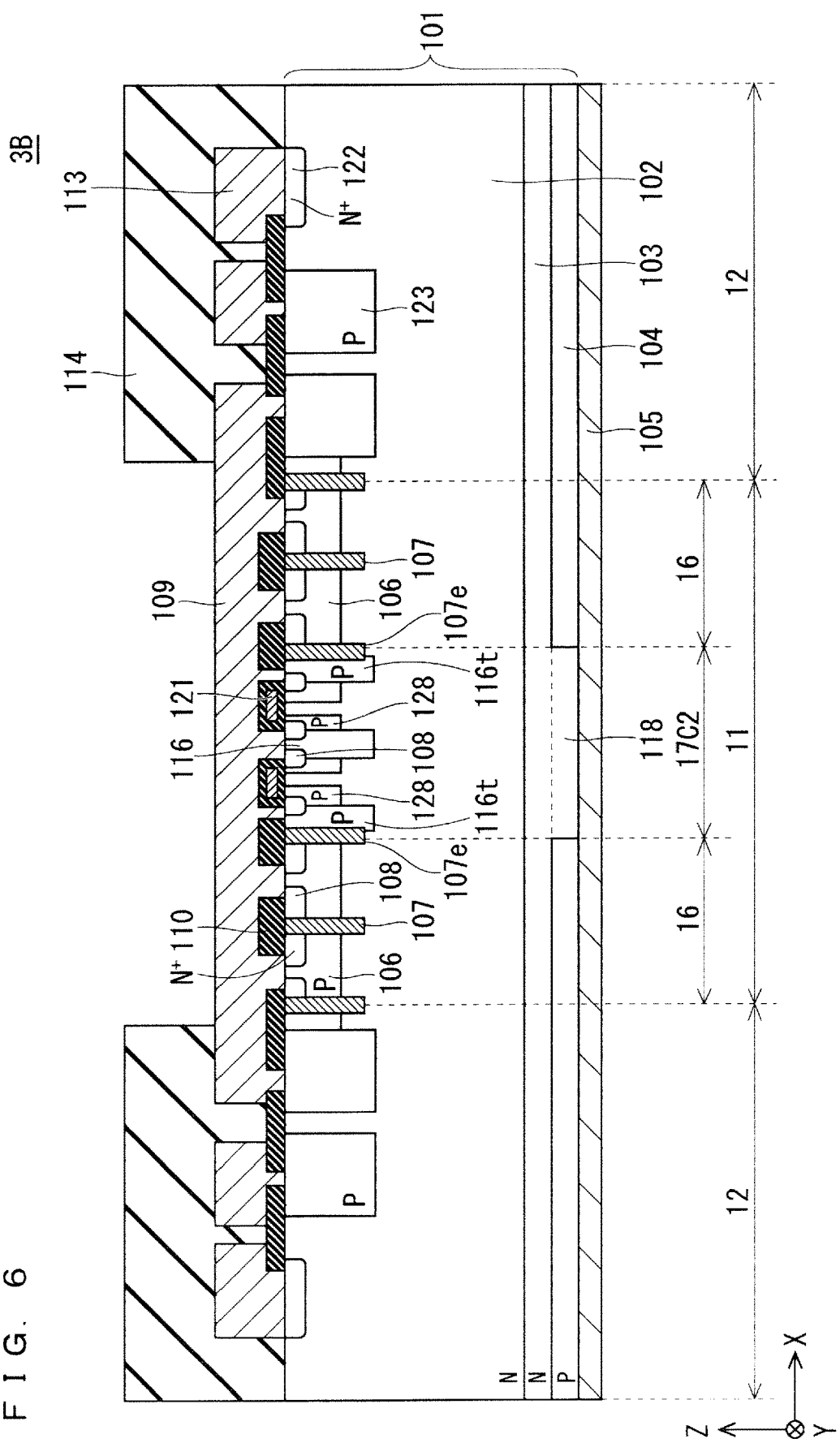
FIG. 6 is a cross-sectional view showing a structure of a semiconductor device as a modified example according to the third preferred embodiment of the present invention.

FIG. 6 is a cross-sectional view showing a structure of a semiconductor device 3B as a modified example according to the third preferred embodiment of the present invention. The semiconductor device 3B of the third preferred embodiment is an RC-IGBT, similarly to the first preferred embodiment.

In the following, characteristics of the semiconductor device 3B of the third preferred embodiment will be mainly described, and structures and operations similar to those in the first preferred embodiment will be denoted by the same reference numerals, and description thereof will be omitted as appropriate.

The semiconductor device 3B has an emitter cell part 11 classified into an IGBT region 16 and a MOSFET region 17C2. Hereinafter, a structure of the MOSFET region 17C2 will be described.

In an upper layer portion of a drift layer 102, a plurality of a channel doped P layers 116 separated from each other are selectively provided. In the upper layer portion of the drift layer 102, a plurality of second channel doped P layers 128 separated from each other are selectively provided.

A relationship between the plurality of channel doped P layers 116 and the plurality of second channel doped P layers 128 is the same as the relationship between the channel doped P layer 116 and the second channel doped P layer 127 in the semiconductor device 3A shown in FIG. 5. Further, corresponding channel doped P layer 116 and second channel doped P layer 128 form a combination channel doped P layer.

Therefore, in the semiconductor device 3B as the modified example of the third preferred embodiment, a plurality of combination channel doped P layers are selectively provided in an upper layer portion of the silicon substrate 101, similarly to the semiconductor device 3A.

Further, in the semiconductor device 3B, similarly to the semiconductor device 3A, an N type source region 108, which is a MOS electrode region, is selectively provided in an upper layer portion of each of the plurality of combination channel doped P layers.

Note that the semiconductor device 3B as the modified example of the third preferred embodiment is different in that the semiconductor device 3B does not have a layer corresponding to the N type diffusion layer 126 in the semiconductor device 3A as the basic example.

In the MOSFET region 17C2, an N type MOSFET is configured by the upper layer portion of the drift layer 102 where the source region 108 and the combination channel doped P layer are not formed, in addition to a part of a channel region of the second channel doped P layer 128, a part of a gate insulating film of an interlayer oxide film 110, and a gate polysilicon 121. Note that the channel region is an upper layer region of the second channel doped P layer 128 where the source region 108 is not formed, below the gate polysilicon 121. Further, the gate insulating film is similar to that of the semiconductor device 1 of the first preferred embodiment.

Also in the MOSFET region 17C2, similarly to the MOSFET region 17C1, the plurality of channel doped P layers 116 include a trench-adjacent channel doped P layer 116t serving as a trench-gate adjacent region.

Then, the semiconductor device 3B has a feature that, similarly to the semiconductor device 3A, a formation depth of the trench-adjacent channel doped P layer 116t is deeper than a formation depth of a boundary trench gate 107e.

Further, the MOSFET region 17C2 contains a diode by mainly a PN junction between the channel doped P layer 116 and the drift layer 102. Therefore, the semiconductor device 3B can operate as an RC-IGBT in which an IGBT and a diode are in antiparallel, by an IGBT formed in the IGBT region 16 and a built-in diode formed in the MOSFET region 17C2.

The channel doped P layer 116 of the semiconductor device 3B as the modified example of the third preferred embodiment having the above-described configuration has the trench-adjacent channel doped P layer 116t corresponding to the trench-adjacent channel doped P layer 115*t* of the semiconductor device 1 of the first preferred embodiment. Therefore, effects similar to those of the first preferred embodiment can be obtained.

Further, in the semiconductor device 3B as the modified example of the third preferred embodiment, the plurality of channel doped P layers 116 and the plurality of second channel doped P layers 128 have the following feature (3B), similarly to the semiconductor device 3A.

(3B) The second channel doped P layer 128 is formed in contact with the channel doped P layer 116 at a side surface, and a formation depth of the second channel doped P layer 128 is shallower than a formation depth of the channel doped P layer 116.

The semiconductor device 3B of the third preferred embodiment has the above feature (3B). Further, similarly to the semiconductor device 3A, the presence of the second channel doped P layer 128, which is a second partial diffusion region, can mitigate electric field concentration at a curved diffusion part interface formed by thermal diffusion of the channel doped P layer 116.

Fourth Preferred Embodiment (Basic Example)

Figure 7:
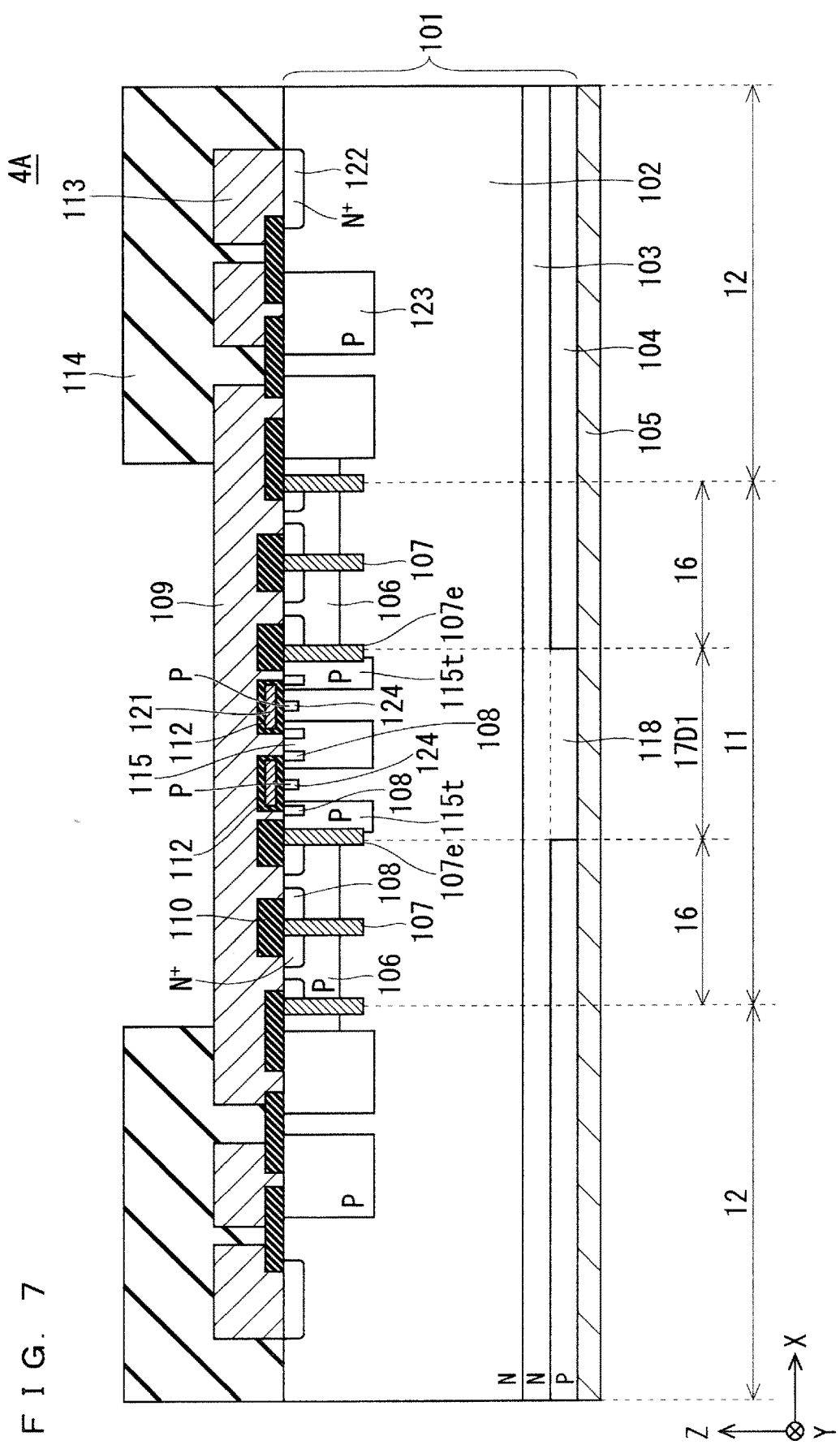
FIG. 7 is a cross-sectional view showing a structure of a semiconductor device as a basic example according to a fourth preferred embodiment of the present invention.

FIG. 7 is a cross-sectional view showing a structure of a semiconductor device 4A as a basic example according to a fourth preferred embodiment of the present invention. The semiconductor device 4A of the fourth preferred embodiment is an RC-IGBT, similarly to the first preferred embodiment.

In the following, characteristics of the semiconductor device 4A of the fourth preferred embodiment will be mainly described, and structures and operations similar to those in the first preferred embodiment will be denoted by the same reference numerals, and description thereof will be omitted as appropriate.

The semiconductor device 4A has an emitter cell part 11 classified into an IGBT region 16 and a MOSFET region 17D1.

In the MOSFET region 17D1, in an upper layer portion of a drift layer 102 between a plurality of channel doped P layers 115, which are a plurality of channel-containing regions provided discretely from each other, a plurality of anode P$^-$ dummy layers 124 are selectively provided without being in contact with each of the channel doped P layers 115 and 115. That is, one anode P$^-$ dummy layer 124 is provided between a pair of adjacent channel doped P layers 115 and 115 among the plurality of channel doped P layers 115, without being in contact with the channel doped P layers 115 and 115.

Each of front surfaces of the plurality of anode P$^-$ dummy layers 124 coincides with a front surface of a silicon substrate 101. The plurality of anode P$^-$ dummy layers 124 serve as at least one upper layer dummy region, and are set to be electrically floating.

In the MOSFET region 17D1, an N type MOSFET is configured by a source region 108, and the upper layer portion of the drift layer 102 where the channel doped P layer 115 and the anode P$^-$ dummy layer 124 are not formed, in addition to a part of a channel region of the second channel doped P layer 115, a part of a gate insulating film of an interlayer oxide film 110, and a gate polysilicon 121. Note that the channel region and the gate insulating film are similar to those of the semiconductor device 1 of the first preferred embodiment.

The semiconductor device 4A of the basic example of the fourth preferred embodiment having the above-described configuration has a trench-adjacent channel doped P layer 115*t*, similarly to the semiconductor device 1 of the first preferred embodiment, and therefore has effects similar to those of the first preferred embodiment.

Further, the plurality of anode P$^-$ dummy layers 124 in the semiconductor device 4A as the basic example of the fourth preferred embodiment have the following feature (4).

(4) The plurality of anode P$^-$ dummy layers 124 are provided in the upper layer portion of the drift layer 102 between the channel doped P layers 115 and 115, without being in contact with the channel doped P layer 115, and are set to be electrically floating.

The basic example of the fourth preferred embodiment has the above feature (4), and the presence of the anode P$^-$ dummy layer 124, which is the upper layer dummy region, can mitigate electric field concentration at a curved diffusion part interface formed by thermal diffusion of the channel doped P layer 115.

(Modified Example)

Figure 8:
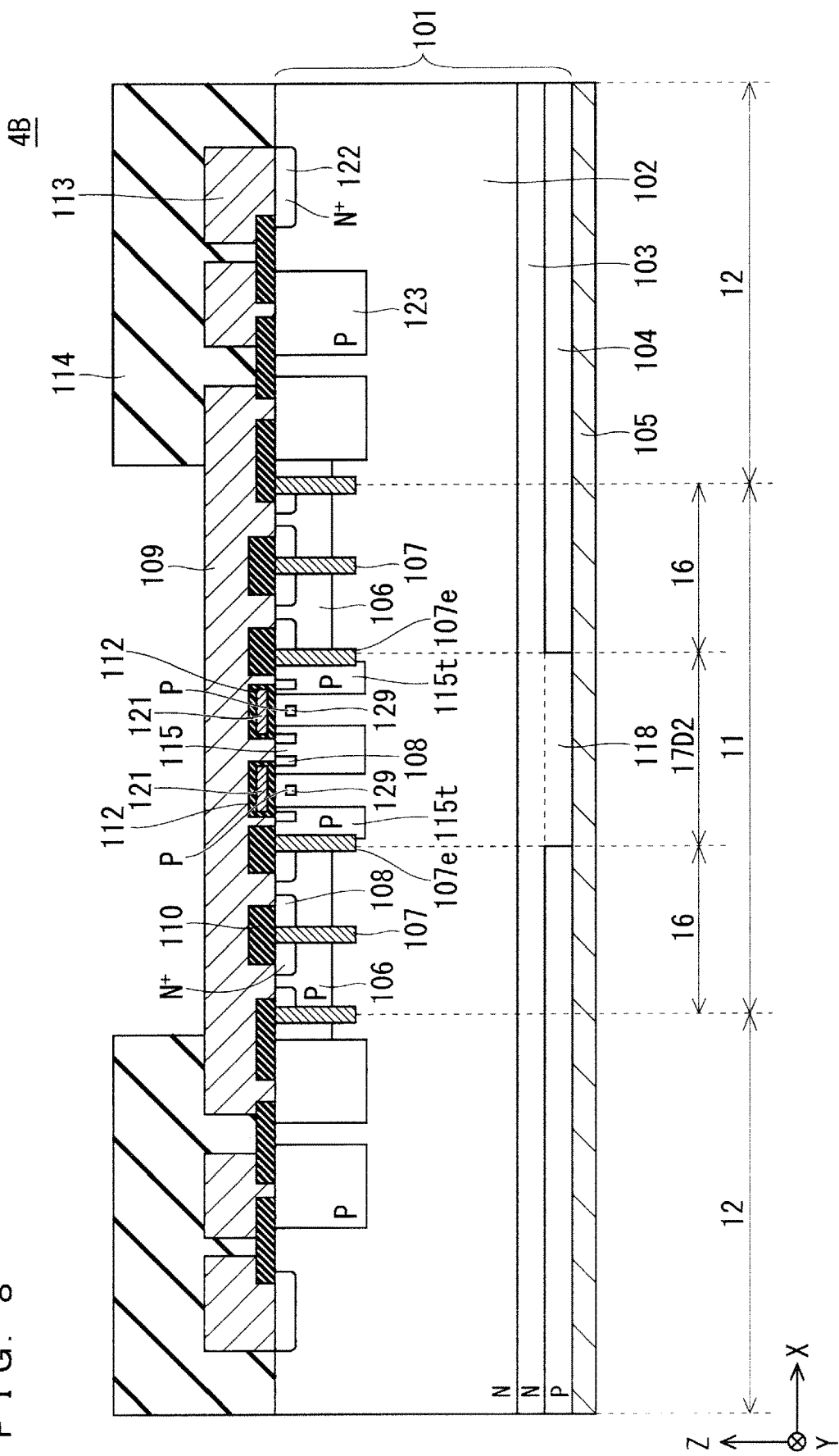
FIG. 8 is a cross-sectional view showing a structure of a semiconductor device as a modified example according to the fourth preferred embodiment of the present invention.

FIG. 8 is a cross-sectional view showing a structure of a semiconductor device 4B as a modified example according to the fourth preferred embodiment of the present invention. The semiconductor device 4B of the fourth preferred embodiment is an RC-IGBT, similarly to the first preferred embodiment.

In the following, characteristics of the semiconductor device 4B of the fourth preferred embodiment will be mainly described, and structures and operations similar to those in the first preferred embodiment will be denoted by the same reference numerals, and description thereof will be omitted as appropriate.

The semiconductor device 4B has an emitter cell part 11 classified into an IGBT region 16 and a MOSFET region 17D2.

In the MOSFET region 17D2, in an upper layer portion of a drift layer 102 between a plurality of channel doped P layers 115, which are a plurality of channel-containing regions provided discretely from each other, a plurality of anode P$^-$ dummy layers 129 are selectively provided without being in contact with each of the channel doped P layers 115 and 115. That is, one anode P$^-$ dummy layer 129 is provided between a pair of adjacent channel doped P layers 115 and 115 among the plurality of channel doped P layers 115, without being in contact with the channel doped P layers 115 and 115.

The plurality of anode P$^-$ dummy layers 129 are formed inside the drift layer 102 such that a front surface of the plurality of anode P$^-$ dummy layers 129 is positioned at a significant buried depth that is not "0", with a front surface that is a first main surface of a silicon substrate 101 as a reference. The plurality of anode P$^-$ dummy layers 129 serve as at least one upper layer dummy region, and are set to be electrically floating.

In the MOSFET region 17D2, an N type MOSFET is configured by a source region 108, and an upper layer portion of the drift layer 102 where the channel doped P layer 115 and the anode P$^-$ dummy layer 129 are not formed, in addition to a part of a channel region of a second channel doped P layer 115, a part of a gate insulating film of an interlayer oxide film 110, and a gate polysilicon 121. Note that the channel region and the gate insulating film are similar to those of the semiconductor device 1 of the first preferred embodiment.

The semiconductor device 4B of the modified example of the fourth preferred embodiment having the above-described configuration has a trench-adjacent channel doped P layer 115*t*, similarly to the semiconductor device 1 of the first preferred embodiment, and therefore has effects similar to those of the first preferred embodiment. Further, the plurality of anode P⁻ dummy layers 129 in the semiconductor device 4B as the modified example of the fourth preferred embodiment have the following feature (4B), similarly to the anode P⁻ dummy layer 124 of the semiconductor device 4A in the basic example.

(4B) The plurality of anode P⁻ dummy layers 129 are provided in the upper layer portion of the drift layer 102 between the channel doped P layers 115 and 115, without being in contact with the channel doped P layer 115, and are set to be electrically floating.

The modified example of the fourth preferred embodiment has the above feature (4B), and the presence of the anode P⁻ dummy layer 129, which is the upper layer dummy region, can mitigate electric field concentration at a curved diffusion part interface formed by thermal diffusion of the channel doped P layer 115.

In addition, the anode P⁻ dummy layer 129 further has the following feature (5).

(5) The anode P⁻ dummy layer 129 is formed inside the drift layer 102 such that a front surface of the anode P⁻ dummy layer 129 is positioned at a buried depth, with a front surface of the silicon substrate 101 as a reference.

Since the semiconductor device 4B as the modified example of the fourth preferred embodiment has the above feature (5), the drift layer 102 has an under-gate region provided below the gate polysilicon 121 that is a planar gate in an upper layer portion shallower than the buried depth described above. The anode P⁻ dummy layer 129 does not exist in the under-gate region.

Therefore, the semiconductor device 4B can form an accumulation layer of an N type, which is a first conductivity type, with spuriously higher concentration in the under-gate region of the drift layer 102, which enables reduction of resistance of the MOSFET.

It should be noted that the present invention can freely combine each preferred embodiment within the scope of the invention, and can deform or omit each preferred embodiment as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device including an IGBT region having an IGBT inside and a MOSFET region having a MOSFET inside, the semiconductor device comprising:
    a semiconductor substrate having first and second main surfaces; and
    a drift layer of a first conductivity type provided in the semiconductor substrate, wherein the IGBT region includes:
        a base layer of a second conductivity type provided in the semiconductor substrate and arranged adjacent on the first main surface side with respect to the drift layer; and
        a trench gate embedded via an insulating film in a region reaching a part of the drift layer from the first main surface side through the base layer,
    the MOSFET region includes:
        a channel-containing region of a second conductivity type provided in the semiconductor substrate and selectively provided in an upper layer portion of the drift layer; and
        a MOS electrode region of a first conductivity type selectively provided in an upper layer portion of the channel-containing region, in which at least a part of an upper layer portion of the channel-containing region where the MOS electrode region is not formed is defined as a channel region,
    the MOSFET region further includes a planar gate provided on the channel region via a gate insulating film,
    a MOSFET of the first conductivity type is configured including the channel region, the gate insulating film, and the planar gate,
    the trench gate includes a boundary trench gate existing at a boundary between the IGBT region and the MOSFET region,
    the channel-containing region includes a trench-gate adjacent region whose side surface is in contact with the boundary trench gate, and
    a formation depth of a bottom surface of the trench-gate adjacent region is deeper than a formation depth of a bottom surface of the boundary trench gate in a depth direction from the first main surface to the second main surface.

2. The semiconductor device according to claim 1, wherein
    the channel-containing region includes a plurality of channel-containing regions provided discretely from each other,
    the MOSFET region further includes at least one upper diffusion region of a first conductivity type provided in an upper layer portion of the drift layer between the plurality of channel-containing regions,
    the MOSFET is configured including the MOS electrode region and the at least one upper diffusion region, in addition to the channel region, the gate insulating film, and the planar gate,
    the at least one upper diffusion region has higher impurity concentration of a first conductivity type than that of the drift layer, and
    a formation depth of the at least one upper diffusion region is shallower than a formation depth of the plurality of channel-containing regions.

3. The semiconductor device according to claim 1, wherein
    the channel-containing region includes a first partial diffusion region of a second conductivity type, and a second partial diffusion region of a second conductivity type provided with a side surface in contact with the first partial diffusion region, the first partial diffusion region includes the trench-gate adjacent region,
    an upper layer portion of the second partial diffusion region where the MOS electrode region is not formed is defined as the channel region, and
    a formation depth of the second partial diffusion region is shallower than a formation depth of the first partial diffusion region.

4. The semiconductor device according to claim 2, wherein
    the plurality of channel-containing regions include a plurality of first and second partial diffusion regions, and corresponding first and second partial diffusion regions among the plurality of first and second partial diffusion regions have side surfaces in contact with each other to integrally form the channel-containing region, the plurality of first partial diffusion regions include the trench-gate adjacent region, and a formation depth of the plurality of second partial diffusion regions is shallower than a formation depth of the at least one upper diffusion region.

5. The semiconductor device according to claim 1, wherein the channel-containing region includes a plurality of channel-containing regions that are discretely from each other, the MOSFET region further includes at least one upper layer dummy region of a first conductivity type provided in an upper layer portion of the drift layer between the plurality of channel-containing regions, without being in contact with the plurality of channel-containing regions, and the at least one upper layer dummy region is set to be electrically floating.

6. The semiconductor device according to claim 5, wherein the at least one upper layer dummy region is formed inside the drift layer such that a front surface of the at least one upper layer dummy region is positioned at a buried depth, with the first main surface of the semiconductor substrate as a reference, and the drift layer has an under-gate region having a planar gate above.

* * * * *